United States Patent
Kido et al.

(10) Patent No.: US 11,919,092 B2
(45) Date of Patent: Mar. 5, 2024

(54) CUTTING TOOL

(71) Applicant: Sumitomo Electric Hardmetal Corp., Itami (JP)

(72) Inventors: Yasuki Kido, Itami (JP); Anongsack Paseuth, Itami (JP); Susumu Okuno, Itami (JP); Shinya Imamura, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 294 days.

(21) Appl. No.: 17/291,282

(22) PCT Filed: Feb. 27, 2020

(86) PCT No.: PCT/JP2020/008144
§ 371 (c)(1),
(2) Date: May 5, 2021

(87) PCT Pub. No.: WO2020/213260
PCT Pub. Date: Oct. 22, 2020

(65) Prior Publication Data
US 2022/0001456 A1 Jan. 6, 2022

(30) Foreign Application Priority Data
Apr. 17, 2019 (JP) .................. 2019-078672

(51) Int. Cl.
*B23B 27/14* (2006.01)
*B23C 5/16* (2006.01)

(52) U.S. Cl.
CPC .............. *B23B 27/148* (2013.01); *B23C 5/16* (2013.01); *B23B 2222/04* (2013.01); *B23B 2222/88* (2013.01)

(58) Field of Classification Search
CPC ........ B23B 2200/242; B23B 2200/245; B23B 2200/24; B23B 2224/24; B23B 2224/08;
(Continued)

(56) References Cited

U.S. PATENT DOCUMENTS 8,137,795 B2 * 3/2012 Omori .................. B23B 27/141
51/307
11,007,578 B2 * 5/2021 Sato .................... C23C 14/0021
(Continued)

FOREIGN PATENT DOCUMENTS

JP 9-295204 A 11/1997
JP 9-300106 A 11/1997
(Continued)

*Primary Examiner* — Alan Snyder
(74) *Attorney, Agent, or Firm* — XSENSUS LLP

(57) ABSTRACT

A cutting tool including a rake face, a flank face, and a cutting edge portion, comprising a substrate and an AlTiN layer, the AlTiN layer including cubic $Al_xTi_{1-x}N$ crystal grains, Al having an atomic ratio x of 0.7 or more and 0.95 or less, the AlTiN layer including a central portion, the central portion at the rake face being occupied in area by (200) oriented crystal grains at a ratio of 80% or more, the central portion at the flank face being occupied in area by (200) oriented crystal grains at a ratio of 80% or more, the central portion at the cutting edge portion being occupied in area by (200) oriented crystal grains at a ratio of 80% or more.

13 Claims, 6 Drawing Sheets

(58) Field of Classification Search
CPC ............ B23B 2224/04; B23B 2224/36; B23B 2224/12; B23B 2228/36; B23B 2228/10; B23B 2228/105; B23B 27/148; B23C 2200/246; B23C 2200/243; B23C 2224/24; C23C 28/044
See application file for complete search history.

(56) References Cited

U.S. PATENT DOCUMENTS

| | | |
|---|---|---|
| 2011/0003126 A1 | 1/2011 | Van Den Berg et al. |
| 2015/0292078 A1 | 10/2015 | Tanaka et al. |
| 2018/0029144 A1* | 2/2018 | Ono ...................... C23C 16/455 |

FOREIGN PATENT DOCUMENTS

| | | |
|---|---|---|
| JP | 10-330914 A | 12/1998 |
| JP | 2000-326108 A | 11/2000 |
| JP | 2003-127003 A | 5/2003 |
| JP | 2005-22071 A | 1/2005 |
| JP | 2011-513594 A | 4/2011 |
| JP | 2014-193521 A | 10/2014 |
| JP | 2015-193049 A | 11/2015 |

* cited by examiner

CUTTING TOOL

CROSS-REFERENCE TO RELATED APPLICATIONS

The present application is based on PCT filing PCT/JP2020/008144, filed Feb. 27, 2020, which claims priority to JP 2019-078672, filed Apr. 17, 2019, the entire contents of each are incorporated herein by reference.

TECHNICAL FIELD

The present disclosure relates to a cutting tool. The present application claims priority based on Japanese Patent Application No. 2019-078672 filed on Apr. 17, 2019. All contents described in the Japanese patent application are incorporated herein by reference.

BACKGROUND ART

Conventionally, cutting tools made of cemented carbide or cubic boron nitride sintered material (cBN sintered material) have been used to cut steel and castings. In a cutting process, such cutting tools have their cutting edges exposed to a harsh environment such as high temperature and high stress, which invites wearing and chipping of the cutting edge.

Accordingly, suppressing the wearing and chipping of the cutting edge is important in improving the cutting performance of the cutting tool and hence extending the life of the cutting tool.

In order to improve a cutting tool in cutting performance (e.g., breaking resistance, crater wear resistance and flank wear resistance), a coating which coats a surface of a substrate of cemented carbide, a cBN sintered material and the like has been developed. Inter alia, a coating composed of a compound of aluminum (Al), titanium (Ti) and nitrogen (N) (hereinafter also referred to as "AlTiN") can have high hardness and also enhance oxidation resistance. (For example see Japanese Patent Laying-Open Nos. 9-295204 (PTL 1), 9-300106 (PTL 2), and 10-330914 (PTL 3)).

CITATION LIST

Patent Literature

PTL 1: Japanese Patent Laid-Open No. 9-295204
PTL 2: Japanese Patent Laid-Open No. 9-300106
PTL 3: Japanese Patent Laid-Open No. 10-330914

SUMMARY OF INVENTION

The presently disclosed cutting tool is
a cutting tool including a rake face, a flank face, and a cutting edge portion connecting the rake face and the flank face together,
the cutting tool comprising a substrate and an AlTiN layer provided on the substrate,
the AlTiN layer including cubic $Al_xTi_{1-x}N$ crystal grains,
an atomic ratio x of Al in the $Al_xTi_{1-x}N$ being 0.7 or more and 0.95 or less,
the AlTiN layer including a central portion,
the central portion being a region sandwiched between an imaginary plane D and an imaginary plane E, the imaginary plane D being an imaginary plane which passes through a point 1 μm away in a direction of thickness from a first interface located on a side of the substrate and is parallel to the first interface, the imaginary plane E being an imaginary plane which passes through a point 1 μm away from a second interface opposite to the side of the substrate in the direction of thickness and is parallel to the second interface,
the first interface being parallel to the second interface,
when a cross section of the AlTiN layer obtained when cut along a plane including a normal to the second interface at the rake face and a normal to the second interface at the flank face is subjected to an electron backscattering diffraction image analysis using a field emission scanning microscope to determine a crystal orientation of each of the $Al_xTi_{1-x}N$ crystal grains and a color map is created based thereon,
then, in the color map,
the central portion at the rake face being occupied in area at a ratio of 80% or more by $Al_xTi_{1-x}N$ crystal grains having a (200) plane with a normal thereto having a direction within ±15° with respect to a direction of the normal to the second interface at the rake face,
the central portion at the flank face being occupied in area at a ratio of 80% or more by $Al_xTi_{1-x}N$ crystal grains having the (200) plane with a normal thereto having a direction within ±15° with respect to a direction of the normal to the second interface at the flank face,
the central portion at the cutting edge portion being occupied in area at a ratio of 80% or more by $Al_xTi_{1-x}N$ crystal grains having the (200) plane with a normal thereto having a direction within ±15° with respect to a direction of a normal to the cutting edge portion,
the direction of the normal to the cutting edge portion being a direction of a normal to an imaginary plane C including a boundary line on the substrate between the rake face and the cutting edge portion and a boundary line on the substrate between the flank face and the cutting edge portion.

DETAILED DESCRIPTION

Figure 1:
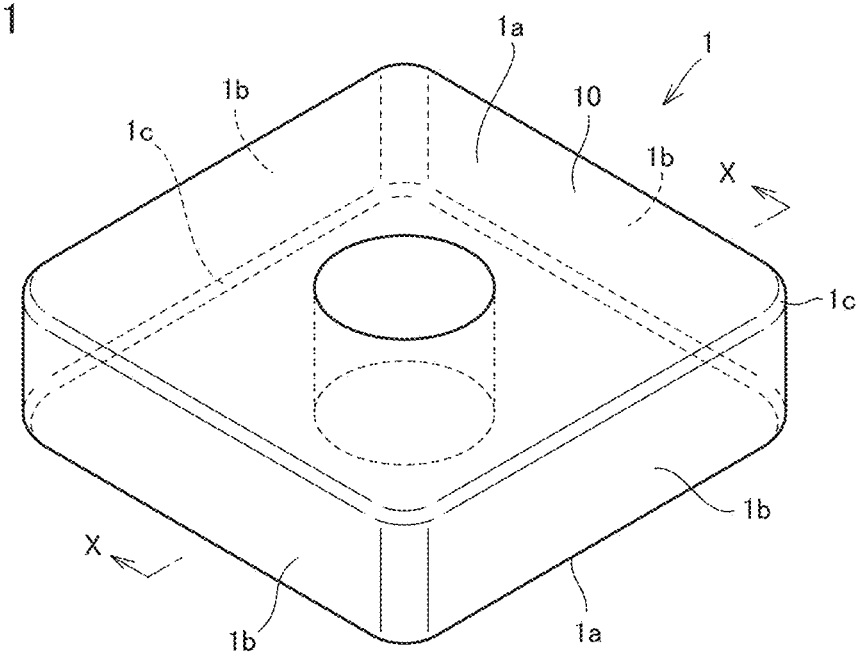
FIG. 1 is a perspective view for illustrating one embodiment of a cutting tool.

Problems to be Solved by the Present Disclosure

In recent years, more efficient (or higher cutting speed and higher feed rate) cutting processing has been demanded, and further improvement is expected in stability (e.g., suppression of chipping and breaking of a rake face, a cutting edge portion and a flank face) of a cutting tool used for cutting stainless steel (for example, SUS630), in particular.

The present disclosure has been made in view of the above circumstances, and an object thereof is to provide a cutting tool having excellent chipping resistance.

Advantageous Effect of the Present Disclosure

According to the present disclosure, a cutting tool having excellent chipping resistance can be provided.

Description of Embodiment of the Present Disclosure

First, embodiments of the present disclosure will be listed and described.

[1] The presently disclosed cutting tool includes
a cutting tool including a rake face, a flank face, and a cutting edge portion connecting the rake face and the flank face together,
the cutting tool comprising a substrate and an AlTiN layer provided on the substrate,
the AlTiN layer including cubic $Al_xTi_{1-x}N$ crystal grains,
the atomic ratio x of Al in the $Al_xTi_{1-x}N$ being 0.7 or more and 0.95 or less,
the AlTiN layer including a central portion,
the central portion being a region sandwiched between an imaginary plane D and an imaginary plane E, the imaginary plane D being an imaginary plane which passes through a point 1 μm away in a direction of thickness from a first interface located on a side of the substrate and is parallel to the first interface, the imaginary plane E being an imaginary plane which passes through a point 1 μm away from a second interface opposite to the side of the substrate in the direction of thickness and is parallel to the second interface,
the first interface being parallel to the second interface,
when a cross section of the AlTiN layer obtained when cut along a plane including a normal to the second interface at the rake face and a normal to the second interface at the flank face is subjected to an electron backscattering diffraction image analysis using a field emission scanning microscope to determine a crystal orientation of each of the $Al_xTi_{1-x}N$ crystal grains and a color map is created based thereon,
then, in the color map,
the central portion at the rake face being occupied in area at a ratio of 80% or more by $Al_xTi_{1-x}N$ crystal grains having a (200) plane with a normal thereto having a direction within ±15° with respect to a direction of the normal to the second interface at the rake face,
the central portion at the flank face being occupied in area at a ratio of 80% or more by $Al_xTi_{1-x}N$ crystal grains having the (200) plane with a normal thereto having a direction within ±15° with respect to a direction of the normal to the second interface at the flank face,
the central portion at the cutting edge portion being occupied in area at a ratio of 80% or more by $Al_xTi_{1-x}N$ crystal grains having the (200) plane with a normal thereto having a direction within ±15° with respect to a direction of a normal to the cutting edge portion,
the direction of the normal to the cutting edge portion being a direction of a normal to an imaginary plane C including a boundary line on the substrate between the rake face and the cutting edge portion and a boundary line on the substrate between the flank face and the cutting edge portion.

The above cutting tool thus configured has excellent chipping resistance. As used herein, "chipping resistance" means resistance against breakage of a small scale at a rake face, a cutting edge portion and a flank face (i.e., breakage of an extent that does not immediately reach an end of life). The present inventors consider that when a cutting tool has chipped, then, with this chipping as a starting point, the cutting tool will be abnormally worn or broken. Note that "breaking resistance" means resistance against mechanical breakage at a rake face, and breakage caused as a workpiece is seized on a cutting edge portion and a flank face. "Mechanical breakage" means breakage attributed to impact caused when a cutting tool collides against a workpiece.

[2] The AlTiN layer has a thickness of 2.5 μm or more and 20 μm or less. By defining in this way, the cutting tool can be further excellent in chipping resistance.

[3] The cutting tool further includes an underlying layer provided between the substrate and the AlTiN layer, and
the underlying layer is composed of a compound consisting of: at least one element selected from the group consisting of a group 4 element, a group 5 element and a group 6 element of the periodic table and aluminum; and at least one element selected from the group consisting of carbon, nitrogen, oxygen and boron. By defining in this way, the cutting tool can have chipping resistance and, in addition thereto, the AlTiN layer with excellent peel resistance.

[4] The cutting tool further includes a surface layer provided on the AlTiN layer, and
the surface layer is composed of a compound consisting of: at least one element selected from the group consisting of a group 4 element, a group 5 element and a group 6 element of the periodic table and aluminum; and at least one element selected from the group consisting of carbon, nitrogen, oxygen and boron. By defining in this way, the cutting tool can be further excellent in chipping resistance.

Details of Embodiments of the Present Disclosure

Hereinafter, an embodiment of the present disclosure (hereinafter also referred to as "the present embodiment") will be described. It should be noted, however, that the present embodiment is not exclusive. In the present specification, an expression in the form of "X to Y" means a range's upper and lower limits (that is, X or more and Y or less), and when X is not accompanied by any unit and Y is alone accompanied by a unit, X has the same unit as Y. Further, in the present specification, when a compound is represented by a chemical formula with its constituent elements having a composition ratio unspecified, such as "TiN," the chemical formula shall encompass any conventionally known composition ratio (or elemental ratio). The chemical formula shall include not only a stoichiometric composition but also a nonstoichiometric composition. For example, the chemical formula of "TiN" includes not only a stoichiometric composition of "$Ti_1N_1$" but also a non-stoichiometric composition for example of "$Ti_1N_{0.8}$." This also applies to descriptions for compounds other than "TiN."

<<Surface-Coated Cutting Tool>>

The presently disclosed cutting tool is a cutting tool including a rake face, a flank face, and a cutting edge portion connecting the rake face and the flank face together, the cutting tool comprising a substrate and an AlTiN layer provided on the substrate, the AlTiN layer including cubic $Al_xTi_{1-x}N$ crystal grains, the atomic ratio x of Al in the $Al_xTi_{1-x}N$ being 0.7 or more and 0.95 or less, the AlTiN layer including a central portion, the central portion being a region sandwiched between an imaginary plane D and an imaginary plane E, the imaginary plane D being an imaginary plane which passes through a point 1 μm away in a direction of thickness from a first interface located on a side of the substrate and is parallel to the first interface, the imaginary plane E being an imaginary plane which passes through a point 1 μm away from a second interface opposite to the side of the substrate in the direction of thickness and is parallel to the second interface, the first interface being parallel to the second interface, when a cross section of the AlTiN layer obtained when cut along a plane including a normal to the second interface at the rake face and a normal to the second interface at the flank face is subjected to an electron backscattering diffraction image analysis using a field emission scanning microscope to determine a crystal orientation of each of the $Al_xTi_{1-x}N$ crystal grains and a color map is created based thereon, then, in the color map, the central portion at the rake face being occupied in area at a ratio of 80% or more by $Al_xTi_{1-x}N$ crystal grains having a (200) plane with a normal thereto having a direction within ±15° with respect to a direction of the normal to the second interface at the rake face, the central portion at the flank face being occupied in area at a ratio of 80% or more by $Al_xTi_{1-x}N$ crystal grains having the (200) plane with a normal thereto having a direction within ±15° with respect to a direction of the normal to the second interface at the flank face, the central portion at the cutting edge portion being occupied in area at a ratio of 80% or more by $Al_xTi_{1-x}N$ crystal grains having the (200) plane with a normal thereto having a direction within ±15° with respect to a direction of a normal to the cutting edge portion, the direction of the normal to the cutting edge portion being a direction of a normal to an imaginary plane C including a boundary line on the substrate between the rake face and the cutting edge portion and a boundary line on the substrate between the flank face and the cutting edge portion.

In the present embodiment, being "parallel" is a concept including not only being geometrically parallel but also being generally parallel.

Figure 6:
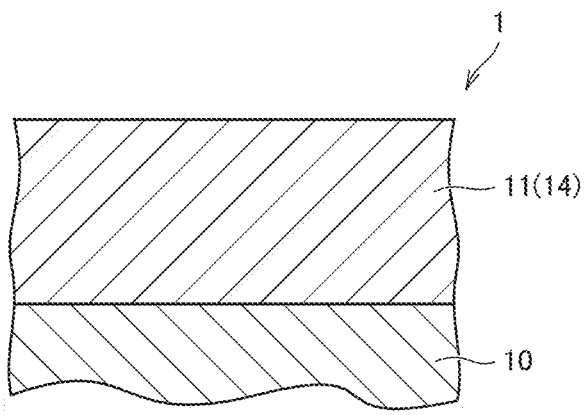
FIG. 6 is a schematic cross section of one embodiment of the cutting tool by way of example.
Figure 7:
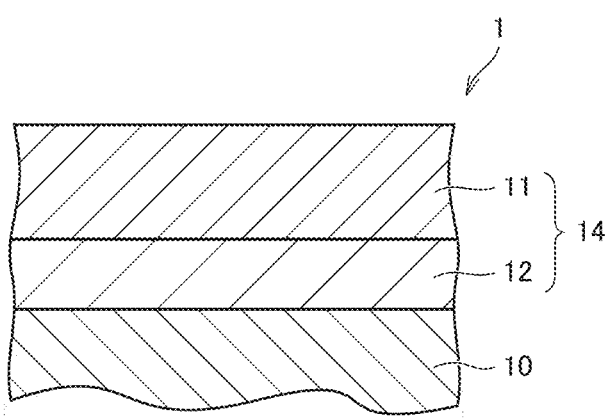
FIG. 7 is a schematic cross section of another embodiment of the cutting tool by way of example.
Figure 8:
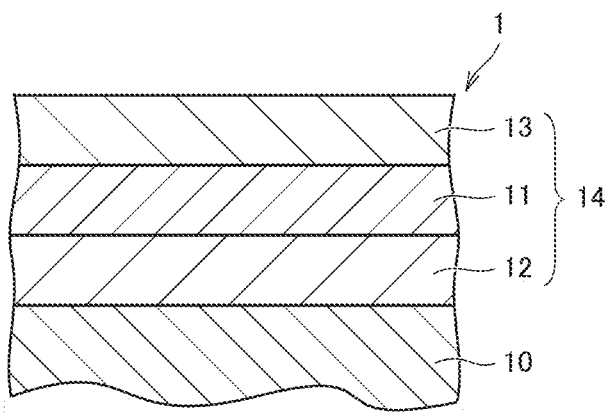
FIG. 8 is a schematic cross section of still another embodiment of the cutting tool by way of example.

A surface-coated cutting tool (hereinafter also simply referred to as a "cutting tool") 1 of the present embodiment includes a substrate 10, and an AlTiN layer 11 provided on substrate 10 (For example, see FIG. 6). In addition to AlTiN layer 11, cutting tool 1 may further include an underlying layer 12 provided between substrate 10 and AlTiN layer 11 (see FIG. 7). Cutting tool 1 may further include a surface layer 13 provided on AlTiN layer 11 (see FIG. 8). Other layers such as underlying layer 12 and surface layer 13 will be described hereinafter.

The above-described layers provided on substrate 10 may be collectively referred to as a "coating." That is, cutting tool 1 includes a coating 14 provided on substrate 10, and the coating includes AlTiN layer 11. Further, coating 14 may further include underlying layer 12 or surface layer 13.

The cutting tool can for example be a drill, an end mill (e.g., a ball end mill), an indexable cutting insert for a drill, an indexable cutting insert for an end mill, an indexable cutting insert for milling, an indexable cutting insert for turning, a metal saw, a gear cutting tool, a reamer, a tap, or the like.

The cutting tool includes a rake face, a flank face, and a cutting edge portion connecting the rake face and the flank face. A "rake face" means a face ejecting chips produced from a workpiece as it is cut. A "flank face" means a face partially brought into contact with the workpiece. Hereinafter, an indexable cutting insert (see FIGS. 1 to 5) will be described as a specific example.

Figure 2:
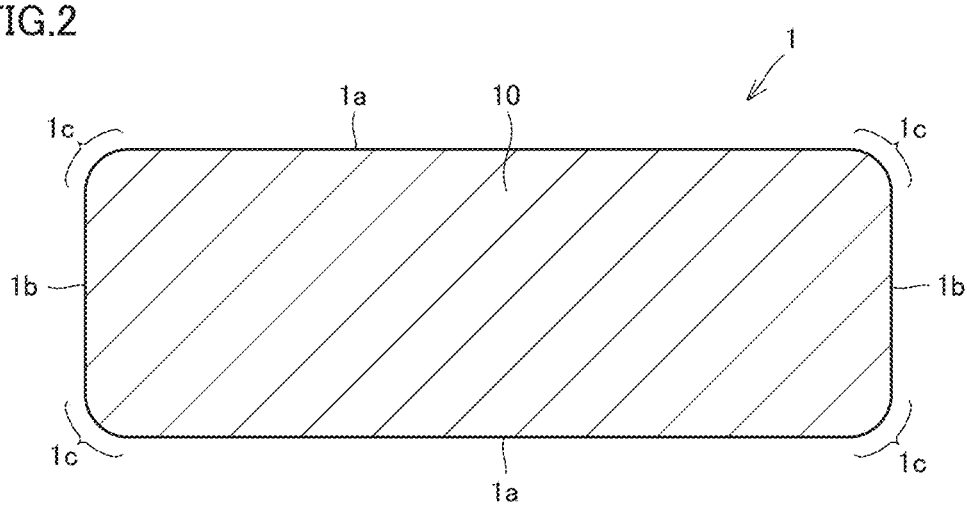
FIG. 2 is a cross section taken along a line X-X indicated in FIG. 1.

FIG. 1 is a perspective view of the cutting tool in one embodiment by way of example. FIG. 2 is a cross section taken along a line X-X indicated in FIG. 1. The cutting tool having such a shape is used as an indexable cutting insert for turning or the like.

Cutting tool 1 shown in FIGS. 1 and 2 has a surface including a top surface, a bottom surface, and four side surfaces, and is generally in the form of a quadrangular prism which is more or less smaller in thickness in the vertical direction. Further, cutting tool 1 has a throughhole penetrating it through the top and bottom surfaces, and the four side surfaces at their boundary portions have adjacent ones thereof connected by an arcuate surface.

Cutting tool 1 has the top and bottom surfaces to form a rake face 1a, the four side surfaces (and each arcuate surface connecting adjacent ones thereof together) to form flank face 1b, and an arcuate surface connecting rake face 1a and flank face 1b together to form a cutting edge portion 1c (see FIG. 2).

Figure 3:
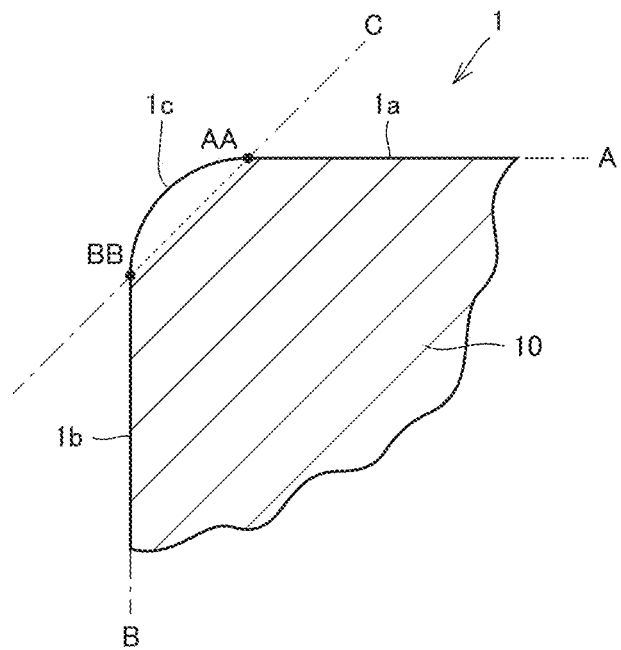
FIG. 3 is a partial enlarged view of FIG. 2.

FIG. 3 is a partial enlarged view of FIG. 2. In FIG. 3, an imaginary plane A, an imaginary boundary line AA, an imaginary plane B, and an imaginary boundary line BB are shown.

Imaginary plane A corresponds to a plane obtained by extending rake face 1a. Boundary line AA is a boundary line between rake face 1a and cutting edge surface 1c. Imaginary plane B corresponds to a plane obtained by extending flank face 1b. Boundary line BB is a boundary line between flank face 1b and cutting edge surface 1c.

The example shown in FIG. 3 shows cutting edge portion 1c having an arcuate surface (or honed), and rake face 1a and flank face 1b connected via cutting edge portion 1c.

Note that, in FIG. 3, imaginary planes A and B are each indicated by a line, and boundary lines AA and BB are each indicated by a dot.

Figure 4:
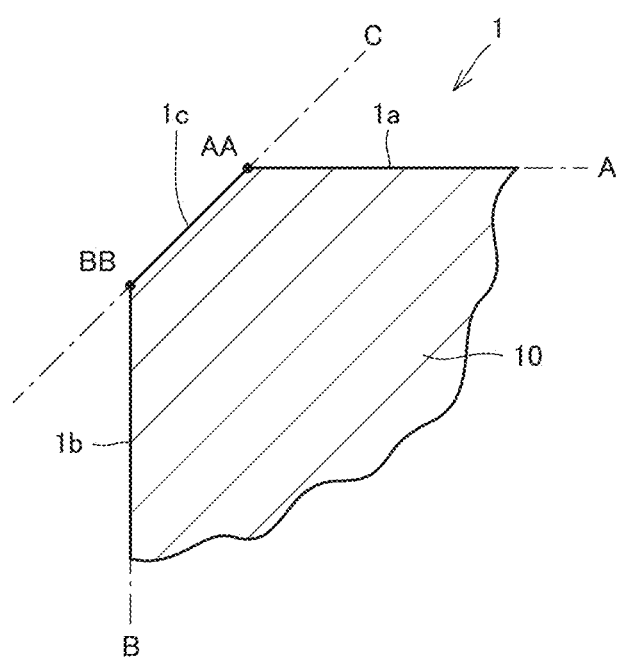
FIG. 4 is a cross section of a cutting edge portion having another shape by way of example.

While FIGS. 1-3 show cutting edge portion 1c having an arcuate surface (or honed), the shape of cutting edge portion 1c is not limited thereto. For example, as shown in FIG. 4, cutting edge portion 1c may have a planar shape (or a negative land). Further, as shown in FIG. 5, cutting edge portion 1c may have a shape having a flat surface and an arcuate surface combined together (a shape having a honing and a negative land combined together).

Figure 5:
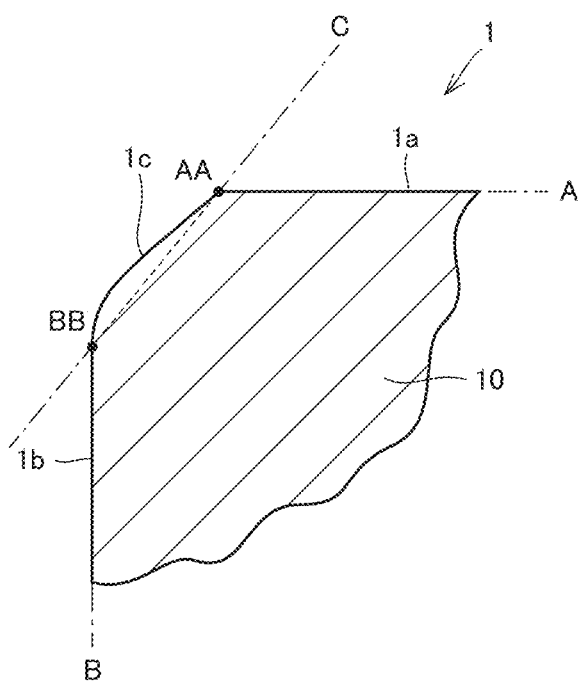
FIG. 5 is a cross section of the cutting edge portion having still another shape by way of example.

As well as the example shown in FIG. 3, the examples shown in FIGS. 4 and 5 also have rake face 1a and flank face 1b connected via cutting edge portion 1c, and imaginary plane A, boundary line AA, imaginary plane B, and boundary line BB are set.

When cutting tool 1 is thus shaped as shown in FIGS. 3 to 5, cutting edge portion 1c can be determined from that shape alone. This is because cutting edge portion 1c in that case is not included in either imaginary plane A or imaginary plane B and rake face 1a and flank face 1b are visually distinguishable.

Cutting edge portion 1c may generally be a surface of substrate 10 of cutting tool 1, as will be described hereinafter, formed by machining a ridge formed by planes. In other words, substrate 10 is obtained by machining at least a portion of a surface of a precursor of the substrate composed of a sintered material or the like, and cutting edge portion 1c may include a surface formed through chamfering by machining.

While the shape of cutting tool 1 and the name of each part thereof have been described with reference to FIGS. 1-5, substrate 10 of the cutting tool according to the present embodiment, the shape of substrate 10 according to the present embodiment and the name of each part thereof that correspond to those of cutting tool 1 will be indicated by similar terminology. That is, substrate 10 of the cutting tool has rake face 1a, flank face 1b, and cutting edge portion 1c connecting rake face 1a and flank face 1b together.

<Substrate>

The substrate of the present embodiment can be any substrate conventionally known as a substrate of this type. For example, it preferably includes at least one selected from the group consisting of a cemented carbide (for example, a tungsten carbide (WC)-base cemented carbide, a cemented carbide containing Co other than WC, a cemented carbide with a carbonitride of Cr, Ti, Ta, Nb, or the like other than WC added, or the like), a cermet (containing Tic, TiN, TiCN, or the like as a major component), a high-speed steel, ceramics (titanium carbide, silicon carbide, silicon nitride, aluminum nitride, aluminum oxide, and the like), a cubic boron nitride sintered material (a cBN sintered material), and a diamond sintered material.

Of these various types of substrates, it is particularly preferable to select a cemented carbide (a WC-base cemented carbide, in particular) or a cermet (a TiCN-base cermet, in particular). This is because these substrates are particularly excellent in balance between hardness and strength at high temperature, in particular, and present excellent characteristics as a substrate for a cutting tool for the above-described application.

When using a cemented carbide as a substrate, the effect of the present embodiment is exhibited even if the cemented carbide has a structure including free carbon or an extraordinary phase referred to as η phase. Note that the substrate used in the present embodiment may have its surface modified. For example, for the cemented carbide, the surface may be provided with a β-free layer, and for the cermet, the surface may be provided with a surface hardened layer, and even if the surface is modified in this way, the effect of the present embodiment is exhibited.

<Coating>

A coating according to the present embodiment includes an AlTiN layer provided on the substrate. The "coating" coats at least a part of the substrate (for example, a rake face that comes into contact with chips during a cutting process, a flank face that comes into contact with a workpiece, and the like) to exhibit a function to improve the cutting tool's various characteristics such as breaking resistance, chipping resistance, wear resistance (e.g., crater wear resistance, flank wear resistance and the like), peeling resistance, and the like. The coating is preferably applied not only to a part of the substrate but also to the entire surface of the substrate. However, even if the substrate is partially uncoated with the coating or the coating is partially different in configuration, such does not depart from the scope of the present embodiment.

The coating's thickness is preferably 2.5 μm or more and 30 μm or less, more preferably 3 μm or more and 25 μm or less. Note that the coating's thickness means a total in thickness of any layers constituting the coating. A "layer constituting the coating" includes an AlTiN layer, an underlying layer, a surface layer and the like, as will be described hereinafter. For example, the thickness of the coating is measured by measuring any 10 points in a sample in a cross section parallel to the direction of a normal to a surface of the substrate with a scanning transmission electron microscope (STEM), and calculating an average value of the measured 10 points in thickness. The same applies when measuring in thickness the AlTiN layer, the underlying layer, the surface layer and the like described hereinafter. The scanning transmission electron microscope is JEM-2100F (trade name) manufactured by JEOL Ltd., for example.

(AlTiN Layer)

The AlTiN layer of the present embodiment contains cubic type $Al_xTi_{1-x}N$ crystal grains (hereinafter also simply referred to as "crystal grains"). That is, the AlTiN layer is a layer including polycrystalline $Al_xTi_{1-x}N$. In the present embodiment, "crystal grains of $Al_xTi_{1-x}N$" mean crystal grains each of a composite crystal formed of a layer made of AlN (aluminum nitride) (hereinafter also referred to as an "AlN layer") and a layer made of TiN (titanium nitride) (hereinafter also referred to as a "TiN layer") alternately stacked. In the present embodiment, the AlN layer also includes a layer having a portion with Al substituted with Ti. Further, the TiN layer also includes a layer having a portion with Ti substituted with Al. For cubic type $Al_xTi_{1-x}N$ crystal grains, the AlN layer and the TiN layer both have an FCC structure (Face-Centered Cubic structure). For hexagonal type $Al_xTi_{1-x}N$ crystal grains described hereinafter, the AlN layer and the TiN layer both have an HCP structure (Hexagonal Close-Packed structure). An atomic ratio x of Al (aluminum) in $Al_xTi_{1-x}N$ is 0.7 or more and 0.95 or less, preferably 0.8 or more and 0.9 or less. The x can be determined by analyzing crystal grains in the AlTiN layer appearing in the cross section of the sample described above with an energy dispersive X-ray (EDX) spectrometer accompanying a scanning electron microscope (SEM) or a TEM. The atomic ratio x of Al thus determined is a value determined as an average of all of the crystal grains of $Al_xTi_{1-x}N$. Specifically, each of any 10 points in the AlTiN layer in the cross section of the sample is measured to obtain a value of the x, and an average value of such values obtained at the 10 points is defined as x in the $Al_xTi_{1-x}N$. Herein, "any 10 points" are selected from different crystal grains of the AlTiN layer. The EDX device is JED-2300 (trade name) manufactured by JEOL Ltd., for example. Not only the atomic ratio of Al but those of Ti and N can also be calculated in the above method.

In the present embodiment, being "provided on the substrate" is not limited to being provided directly on the substrate and also includes being provided on the substrate via another layer. That is, the AlTiN layer may be provided directly on the substrate or may be provided on the substrate via another layer such as an underlying layer described hereinafter insofar as such does not impair an effect of the cutting tool according to the present embodiment.

In one aspect of the present embodiment, being "provided on the substrate" can also be understood as being "disposed on the substrate." That is, it can also be understood that the AlTiN layer may be disposed directly on the substrate or may be disposed on the substrate via another layer such as an underlying layer described hereinafter.

The AlTiN layer may be provided thereon with another layer such as a surface layer. The AlTiN layer may be an outermost surface of the coating.

The AlTiN layer has the following feature: That is, the AlTiN layer includes a central portion, and the central portion is a region sandwiched between an imaginary plane D and an imaginary plane E, the imaginary plane D being an imaginary plane which passes through a point 1 µm away in a direction of thickness from a first interface located on the side of the substrate and is parallel to the first interface, the imaginary plane E being an imaginary plane which passes through a point 1 µm away from a second interface opposite to the side of the substrate in the direction of thickness and is parallel to the second interface. The first interface is parallel to the second interface. When a cross section of the AlTiN layer obtained when cut along a plane including a normal to the second interface at the rake face and a normal to the second interface at the flank face is subjected to an electron backscattering diffraction image analysis using a field emission scanning microscope to determine a crystal orientation of each of the $Al_xTi_{1-x}N$ crystal grains and a color map is created based thereon, then, in the color map, the central portion at the rake face is occupied in area at a ratio of 80% or more by $Al_xTi_{1-x}N$ crystal grains having a (200) plane with a normal thereto having a direction within ±15° with respect to a direction of the normal to the second interface at the rake face (hereinafter also referred to as "(200) oriented crystal grains"), the central portion at the flank face is occupied in area at a ratio of 80% or more by $Al_xTi_{1-x}N$ crystal grains having the (200) plane with a normal thereto having a direction within ±15° with respect to a direction of the normal to the second interface at the flank face, and the central portion at the cutting edge portion is occupied in area at a ratio of 80% or more by $Al_xTi_{1-x}N$ crystal grains having the (200) plane with a normal thereto having a direction within ±15° with respect to a direction of a normal to the cutting edge portion.

Furthermore, the direction of the normal to the cutting edge portion of the substrate is a direction of a normal to imaginary plane C including a boundary line on the substrate between the rake face and the cutting edge portion and a boundary line on the substrate between the flank face and the cutting edge portion.

Figure 9:
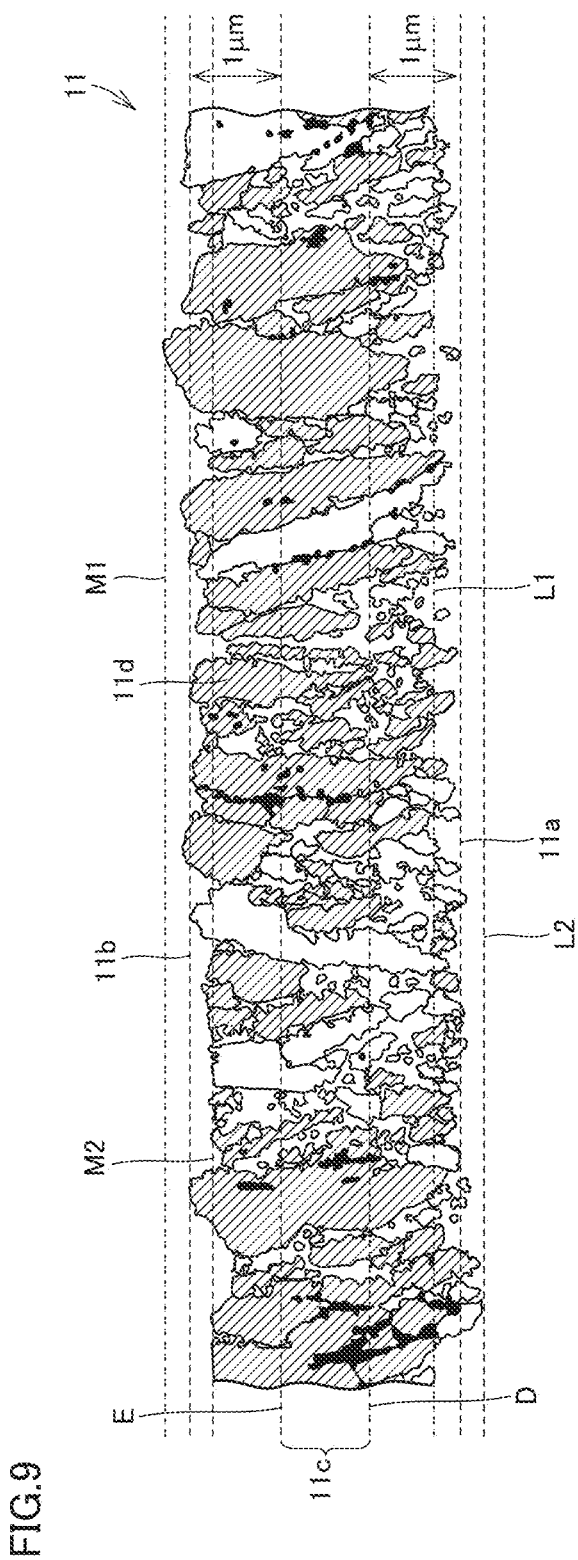
FIG. 9 is a schematic representation of a color map created based on a cross section of an AlTiN layer.

Reference will now be made to FIG. 9 to specifically describe a method for creating the color map. First interface 11a of AlTiN layer 11 shown in FIG. 9 is an interface located on the side of substrate 10, and second interface 11b thereof is an interface located opposite to the side of substrate 10. First interface 11a is parallel to second interface 11b. When AlTiN layer 11 is the outermost surface of the coating, second interface 11b will be a surface of AlTiN layer 11. First interface 11a is a straight line that passes a center between a straight line L1 that passes through a point on the side of the substrate farthest from the substrate in the direction of a normal to a major surface of the substrate in the color map and is also parallel to the major surface of the substrate and a straight line L2 that passes through a point on the side of the substrate closest to the substrate in the same direction and is also parallel to the major surface of the substrate. Second interface 11b is a straight line that passes a center between a straight line M1 that passes through a point on the side opposite to the substrate farthest from the substrate in the direction of the normal to the major surface of the substrate in the color map and is also parallel to the major surface of the substrate and a straight line M2 that passes through a point on the side opposite to the substrate closest to the substrate in the same direction and is also parallel to the major surface of the substrate. Note, however, that an apparently unexpected point is excluded in selecting the "point closest to the substrate" and the "point farthest from the substrate."

Initially, the AlTiN layer is formed on the substrate based on a method described hereinafter. The formed AlTiN layer is cut so as to obtain a cross section perpendicular to the AlTiN layer including the substrate and the like. That is, the cutting is done so as to expose a cut surface of the AlTiN layer cut along a plane including a normal to the second interface at the rake face and a normal to the second interface at the flank face. After that, the cut surface is polished with waterproof abrasive paper (including SiC grain abrasive as an abrasive).

Note that the cutting is done for example as follows: wax or the like is used to closely fix AlTiN layer 11 at a surface thereof (or a surface of a coating when another layer is formed on AlTiN layer 11) on a sufficiently large holding flat plate and thereafter, a rotary blade cutter is used to cut the layer in a direction perpendicular to the flat plate (i.e., cut the layer such that the rotary blade is as vertical as possible to the flat plate). While this cutting can be performed at any portion of AlTiN layer 11 insofar as it is performed in such a vertical direction, it is preferably done in a vicinity of cutting edge portion 1c, as will be described hereinafter.

Furthermore, the cut surface is polished with the waterproof abrasive paper (with #400, followed by #800 followed by #1500). The numbers (#) of the waterproof abrasive paper mean differences in grain size of the abrasive, and a larger number indicates that the abrasive has a smaller grain size.

Subsequently, the polished surface is further smoothed by ion milling using Ar ions. The ion milling was performed under the following conditions:

Acceleration voltage: 6 kV

Irradiation angle: 0° from the direction of a normal to second interface 11b of the AlTiN layer (that is, the direction of a straight line parallel to the direction of the thickness of the AlTiN layer at the cut surface)

Irradiation time: 8 hours

Subsequently the smoothed cross-section (a mirror surface) is observed with a field emission type scanning electron microscope (FE-SEM) (product name: "SU6600" manufactured by Hitachi High-Tech Corporation) equipped with an electron back-scattered diffractometer (an EBSD device) to obtain an image, which is subjected to an EBSD analysis. While where the smoothed cross section is observed is not particularly limited, it is preferable to observe it in a vicinity of cutting edge portion 1c. The observation with the FE-SEM is conducted at a magnification of 5000 times.

For the EBSD analysis, data is successively collected by positioning a focused electron beam on each pixel individually. In doing so, the focused electron beam is set so that it is reflected at the AlN layer in the crystal grain of $Al_xTi_{1-x}N$. In the crystal grain, Al has a higher atomic ratio than Ti, and accordingly, the number of AlN layers is larger than the number of TiN layers. Therefore, the present inventors consider that the crystal orientation of all of the crystal grains can be determined by analyzing the crystal orientation of the AlN layer in the crystal grain. A normal to a sample surface (the smoothed cross section of the AlTiN layer) is inclined by 70 degrees with respect to the incident beam, and the analysis is conducted at 15 kV. In order to avoid a charging effect, a pressure of 10 Pa is applied. A high current mode is used in conformity with an aperture diameter of 60 µm or 120 µm. Data is collected on the cross section for 100×500 points corresponding to a surface area (an observation area) of 10 µm (in the direction of the thickness of the AlTiN layer)×50 µm (in a direction parallel to an interface of the AlTiN layer) in steps of 0.1 µm/step. In doing so, measurement is done in three or more fields of view.

A result of the EBSD analysis is analyzed using commercially available software (trade name: "Orientation Imaging Microscopy Ver 6.2", manufactured by EDAX Inc.) to create the color map. Specifically, initially, the crystal orientation of each crystal grain included in the cross section of AlTiN layer 11 is determined. The crystal orientation of each crystal grain determined herein is a crystal orientation observed when each crystal grain appearing in the cross section of AlTiN layer 11 is observed in a plan view in the direction of a normal to that cross section (i.e., a direction penetrating the plane of the sheet of FIG. 9). Then, based on the obtained crystal orientation of each crystal grain, the crystal orientation of each crystal grain in the direction of the normal to a surface of AlTiN layer 11 (that is, second interface 11b) is determined. A color map is created based on the determined crystal orientation. The color map can be created using a method of "Crystal Direction MAP" included in the above software. Note that the color map is created across an entire area of AlTiN layer 11 observed at the cut surface in the direction of the thickness of the layer. In addition, a crystal grain which is partially outside a field of view for measurement is also counted as one crystal grain.

In FIG. 9, each area surrounded by a solid line and hatched is a (200) oriented crystal grains 11d. Further, each area surrounded by a solid line and unhatched is a crystal grain which does not correspond to a (200) oriented crystal grain. That is, in FIG. 9, crystal grains 11d having the (200) plane with a normal thereto having a direction within ±15° with respect to the direction of a normal to second interface 11b of AlTiN layer 11 is hatched. Although the color map is originally represented in color, in the present specification it is schematically represented in monotone for the sake of convenience. Furthermore, in FIG. 9, there is an area shown in black, which is regarded as an area of a crystal grain having its crystal orientation undetermined in the above method.

In the present embodiment, an $Al_xTi_{1-x}N$ crystal grain's crystal orientation is determined in a central portion 11c of AlTiN layer 11, as shown in FIG. 9. Central portion 11c is a region sandwiched between an imaginary plane D and an imaginary plane E, the imaginary plane D being an imaginary plane which passes through a point 1 µm away in the direction of thickness from first interface 11a located on the side of the substrate and is parallel to first interface 11a, the imaginary plane E being an imaginary plane which passes through a point 1 µm away from second interface 11b opposite to the side of the substrate in the direction of thickness and is parallel to second interface 11b. Imaginary plane D and imaginary plane E can be set on the created color map based on the distance from first interface 1a or second interface 11b.

Note that when cutting edge portion 1c is honed (for example, in the case of FIG. 3), central portion 11c of cutting edge portion 1c is set in the following manner. Initially, the AlTiN layer is divided into a plurality of regions for each range in which curves representing first and second interfaces 11a and 11b, respectively, in the color map can be approximated to straight lines, respectively. Subsequently, central portion 11c is set according to the above method for each of the divided regions. The set of central portions 11c of the divided regions thus set define central portion 11c of cutting edge portion 1c. Further, when cutting edge portion 1c is honed or the like, a (200) oriented crystal grain in cutting edge portion 1c means a crystal grain having a (200) plane with a normal thereto having a direction within ±15° with respect to the direction of a normal to imaginary plane C including a boundary line AA on the substrate between the rake face and the cutting edge portion and a boundary line BB on the substrate between the flank face and the cutting edge portion.

In the color map, the central portion at the rake face is occupied in area at a ratio of 80% or more, preferably 81% or more and 98% or less, more preferably 81% or more and 95% or less by $Al_xTi_{1-x}N$ crystal grains having a (200) plane with a normal thereto having a direction within ±15° with respect to the direction of a normal to the second interface at the rake face. Herein, a ratio in area is a ratio in area with reference to the entirety in area of central portion 11c in the color map.

In the color map, the central portion at the flank face is occupied in area at a ratio of 80% or more, preferably 81% or more and 98% or less, more preferably 81% or more and 95% or less by $Al_xTi_{1-x}N$ crystal grains having a (200) plane with a normal thereto having a direction within ±15° with respect to the direction of a normal to the second interface at the flank face. Herein, a ratio in area is a ratio in area with reference to the entirety in area of central portion 11c in the color map.

In the color map, the central portion at the cutting edge portion is occupied in area at a ratio of 80% or more, preferably 81% or more and 98% or less, more preferably 81% or more and 95% or less by $Al_xTi_{1-x}N$ crystal grains having a (200) plane with a normal thereto having a direction within ±15° with respect to the direction of a normal to the cutting edge portion. The direction of the normal to cutting edge portion 1c is the direction of a normal to imaginary plane C including boundary line AA on substrate 10 between rake face 1a and cutting edge portion 1c and boundary line BB on substrate 10 between flank face 1b and cutting edge portion 1c (see FIGS. 3 to 5). Herein, a ratio in area is a ratio in area with reference to the entirety in area of central portion 11c in the color map.

In the cutting tool according to the present embodiment, all of the rake face, the flank face and the cutting edge portion at the central portion of the AlTiN layer are occupied in area by (200) oriented crystal grains at a ratio of 80% or more. The (200) oriented crystal grain is resistant to stress in an in-plane direction and high in toughness. Therefore, the cutting tool has excellent chipping resistance. The cutting tool can be suitably used for cutting stainless steel (for example, SUS630) in particular.

The AlTiN layer includes cubic $Al_xTi_{1-x}N$ crystal grains. In one aspect of the present embodiment, the AlTiN layer may further include hexagonal $Al_xTi_{1-x}N$ crystal grains unless such impairs an effect of the present disclosure. The cubic $Al_xTi_{1-x}N$ crystal grain and the hexagonal $Al_xTi_{1-x}N$ crystal grain are distinguished by, for example, a pattern of a diffraction peak obtained through x-ray diffraction.

When a total amount of crystal grains of cubic $Al_xTi_{1-x}N$ (c) and crystal grains of hexagonal $Al_xTi_{1-x}N$ (h) serves as a reference, the crystal grains of hexagonal $Al_xTi_{1-x}N$ are contained at a proportion (h/(c+h)) preferably of 0 to 15% by volume, more preferably 0 to 10% by volume. The proportion can be determined for example by analyzing a pattern of a diffraction peak obtained through x-ray diffraction. A specific method is employed, as follows:

An X-ray spectrum of the AlTiN layer at the cross section of the sample as set forth above is obtained using an X-ray diffractometer ("MiniFlex600" (trade name) manufactured by Rigaku Corporation). The X-ray diffractometer's conditions are for example as follows:

Characteristic X-ray: Cu-Kα (wavelength: 1.54 angstrom)
Tube voltage: 45 kV
Tube current: 40 mA
Filter: Multi-layer mirror
Optical system: Focusing method
X-ray diffraction method: θ-2θ method In the obtained X-ray spectrum, cubic $Al_xTi_{1-x}N$'s peak intensity (Ic) and hexagonal $Al_xTi_{1-x}N$'s peak intensity (Ih) are measured. Herein, a "peak intensity" means a peak's height (cps) in the X-ray spectrum. Cubic $Al_xTi_{1-x}N$'s peak can be confirmed around diffraction angles 2θ=38° and 44°. Hexagonal $Al_xTi_{1-x}N$'s peak can be confirmed around a diffraction angle 2θ=33°. A peak intensity is a value excluding a background.

When a total amount of the cubic $Al_xTi_{1-x}N$ and the hexagonal $Al_xTi_{1-x}N$ serves as a reference, the hexagonal $Al_xTi_{1-x}N$ is contained at a proportion (vol %), as calculated by an expression indicated hereinafter. The cubic $Al_xTi_{1-x}N$'s peak intensity (Ic) is obtained by the sum of a peak intensity around θ=38° and a peak intensity around θ=44°.

Proportion of the hexagonal $Al_xTi_{1-x}N$ contained (vol %)=Ih/(Ih+Ic)×100

(Thickness of AlTiN Layer)

In the present embodiment, the AlTiN layer has a thickness preferably of 2.5 µm or more and 20 µm or less, more preferably 3 µm or more and 20 µm or less, still more preferably 5 µm or more and 15 µm or less. This allows such an excellent effect as above to be presented.

When the AlTiN layer has a thickness of less than 2.5 µm, breaking resistance attributed to the presence of the AlTiN layer tends to be less improved. When the AlTiN layer has a thickness exceeding 20 µm, an interfacial stress attributed to a difference in linear expansivity between the AlTiN layer and another layer is increased, and crystal grains of $Al_xTi_{1-x}N$ may escape from the AlTiN layer.

(Underlying Layer)

The coating preferably further includes an underlying layer provided between the substrate and the AlTiN layer, and the underlying layer is composed preferably of a compound consisting of at least one element selected from the group consisting of a group 4 element, a group 5 element and a group 6 element of the periodic table and aluminum (Al) and at least one element selected from the group consisting of carbon, nitrogen, oxygen and boron. Examples of the Group 4 element of the periodic table include titanium (Ti), zirconium (Zr), hafnium (Hf), and the like. Examples of the Group 5 element of the periodic table include vanadium (V), niobium (Nb), tantalum (Ta), and the like. Examples of the Group 6 element of the periodic table include chromium (Cr), molybdenum (Mo), tungsten (W), and the like. The underlying layer is preferably composed of a compound represented by TiCN. Such an underlying layer exhibits strong adhesion to the AlTiN layer. As a result, the coating is enhanced in peel resistance.

The underlying layer preferably has a thickness of 0.1 µm or more and 20 µm or less, more preferably 1 µm or more and 15 µm or less. Such a thickness can be confirmed by observing a vertical cross section of the substrate and the coating with a scanning transmission electron microscope (STEM) or the like, similarly as has been described above.

(Surface Layer)

The coating preferably further includes a surface layer provided on the AlTiN layer, and the surface layer is composed preferably of a compound consisting of at least one element selected from the group consisting of a group 4 element, a group 5 element and a group 6 element of the periodic table and aluminum (Al) and at least one element selected from the group consisting of carbon, nitrogen, oxygen and boron.

The compound included in the surface layer includes $Al_2O_3$ and TiN for example.

The surface layer preferably has a thickness of 0.1 µm or more and 3 µm or less, more preferably 0.3 µm or more and 2 µm or less. Such a thickness can be confirmed by observing a vertical cross section of the substrate and the coating with a scanning transmission electron microscope (STEM) or the like, similarly as has been described above.

(Another Layer)

The coating may further include another layer insofar as it does not impair an effect of the cutting tool according to the present embodiment. The other layer may have a composition different from or identical to that of the AlTiN layer, the underlying layer, or the surface layer. Examples of the compound included in the other layer include TiN, TiCN, TiBN, and $Al_2O_3$. The other layer is not limited, either, in in what order it is stacked. For example, an example of the other layer is an intermediate layer provided between the underlying layer and the AlTiN layer. While the other layer is not particularly limited in thickness as long as it does not impair an effect of the present embodiment, it is for example 0.1 µm or more and 20 µm or less.

<<Method for Manufacturing a Surface-Coated Cutting Tool>>

A method for manufacturing a cutting tool according to the present embodiment includes:

a first step of preparing the substrate (hereinafter also simply referred to as a "first step");

a second step of depositing the AlTiN layer on the substrate through chemical vapor deposition (hereinafter also simply referred to as a "second step"); and a third step of blasting the AlTiN layer (hereinafter also simply referred to as a "third step"), the second step including jetting a first gas, a second gas and a third gas onto the substrate in an atmosphere of 650° C. or higher and 900° C. or lower and 0.5 kPa or higher and 30 kPa or lower, the first gas including a gas of a halide of aluminum and a gas of a halide of titanium, the second gas including a gas of a halide of aluminum, a gas of a halide of titanium and a gas of ammonia, the third gas including a gas of ammonia.

<First Step: Step of Preparing a Substrate>

In the first step, a substrate is prepared. For example, a cemented carbide substrate is prepared as the substrate. The cemented carbide substrate may be a commercially available product or may be manufactured in a typical powder metallurgy method. When manufactured in a typical powder metallurgy method, for example, WC powder and Co powder are mixed using a ball mill or the like to obtain a powdery mixture. After the powdery mixture is dried, it is shaped into a prescribed shape (for example, SEET13T3AGSN-G, etc.) to obtain a shaped body. The shaped body is sintered to obtain a WC—Co based cemented carbide (a sintered material). Subsequently, the sintered material can be honed or subjected to a prescribed cutting edge process to prepare a substrate made of the WC—Co based cemented carbide. In the first step, any other substrate may be prepared insofar as it is a substrate conventionally known as a substrate of this type.

<Second Step: Step of Jetting First Gas, Second Gas and Third Gas to the Substrate to Form an AlTiN Layer>

In the second step, a first gas, a second gas and a third gas are jetted onto the substrate in an atmosphere of 650° C. or higher and 900° C. or lower and 0.5 kPa or higher and 30 kPa or lower, the first gas including a gas of a halide of aluminum and a gas of a halide of titanium, the second gas including a gas of a halide of aluminum, a gas of a halide of titanium and a gas of ammonia, the third gas including a gas of ammonia. This step can be performed using, for example, a CVD apparatus described below.

(CVD Apparatus)

Figure 10:
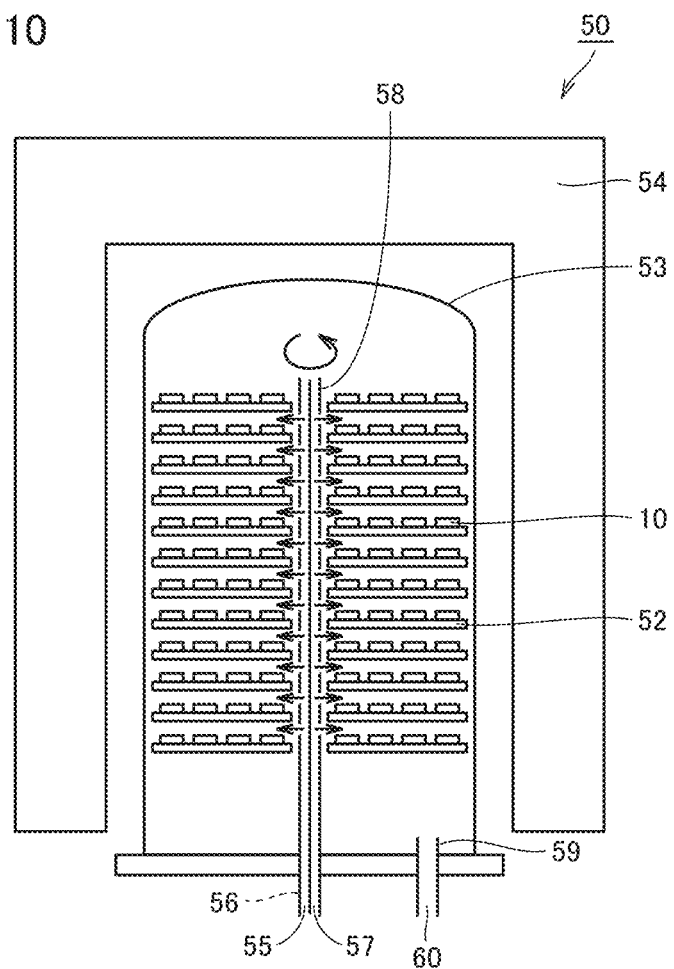
FIG. 10 is a schematic cross section of a CVD apparatus used for manufacturing the cutting tool according to the present embodiment.

FIG. 10 is a schematic cross section of one example of a CVD apparatus used for manufacturing the cutting tool according to the present embodiment. As shown in FIG. 10, a CVD apparatus 50 includes a plurality of substrate setting jigs 52 for setting substrate 10, and a reaction chamber 53 made of heat-resistant alloy steel and including substrate setting jigs 52 therein. A temperature controller 54 is provided around reaction chamber 53 for controlling the temperature inside reaction chamber 53. In the present embodiment, substrate 10 is preferably set on a protrusion provided on substrate setting jig 52. This allows deposition to be done on each of the rake face, the flank face and the cutting edge portion uniformly.

Figure 11:
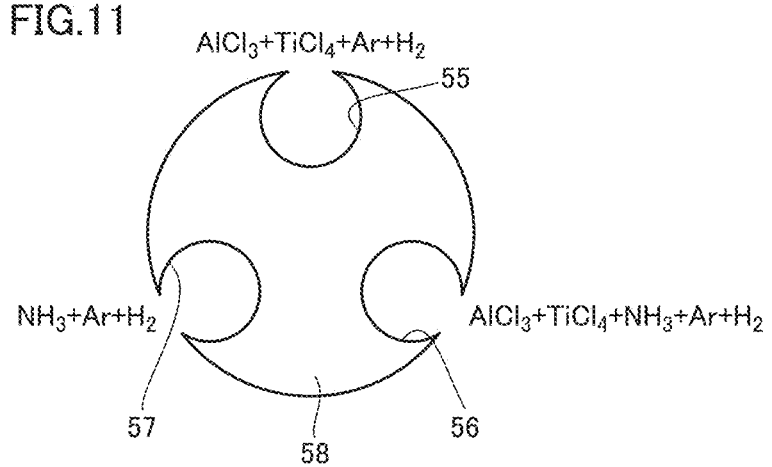
FIG. 11 is a schematic cross section of a gas introduction pipe of the CVD apparatus used in manufacturing the cutting tool according to the present embodiment.

A gas introduction pipe 58 having a first gas introduction pipe 55, a second gas introduction pipe 56 and a third gas introduction pipe 57 adjacently bonded together extends in the vertical direction through a space inside reaction chamber 53 rotatably about the vertical direction. Gas introduction pipe 58 is configured such that the first gas introduced into first gas introduction pipe 55, the second gas introduced into second gas introduction pipe 56, and the third gas introduced into third gas introduction pipe 57 are not mixed together inside gas introduction pipe 58 (see FIG. 11). Further, first gas introduction pipe 55, second gas introduction pipe 56, and third gas introduction pipe 57 are each provided with a plurality of throughholes for jetting the gases respectively flowing through first, second and third gas introduction pipes 55, 56 and 57 onto substrate 10 set on substrate setting jig 52. In the present embodiment it is preferable that the gas jetting throughholes and substrate 10 be sufficiently spaced. This allows the first, second and third gases to flow uniformly and can prevent turbulence.

Further, reaction chamber 53 is provided with a gas exhaust pipe 59 for externally exhausting the gas inside reaction chamber 53, and the gas in reaction chamber 53 passes through gas exhaust pipe 59 and is exhausted out of reaction chamber 53 via a gas exhaust port 60.

More specifically, the first gas, the second gas and the third gas are introduced into first gas introduction pipe 55, second gas introduction pipe 56 and third gas introduction pipe 57, respectively. In doing so, the first, second and third gases in their respective gas introduction pipes may have any temperature that does not liquefy the gases. Subsequently, the first gas, the second gas and the third gas are jetted in this order repeatedly into reaction chamber 53 with an atmosphere set therein to have a temperature of 650° C. or higher and 900° C. or lower (preferably 700° C. or higher and 770° C. or lower) and a pressure of 0.5 kPa or higher and 30 kPa or lower (preferably 2 kPa or higher and 5 kPa or lower). As gas introduction pipe 58 has the plurality of throughholes, the first, second, and third gases introduced are jetted into reaction chamber 53 through different throughholes, respectively. While the gases are thus jetted, gas introduction pipe 58 is rotating at a rotation speed for example of 2 to 4 rpm about the above-mentioned axis, as indicated in FIG. 10 by a rotating arrow. As a result, the first gas, the second gas, and the third gas can be jetted in this order repeatedly onto substrate 10.

(First Gas)

The first gas includes a gas of a halide of aluminum and a gas of a halide of titanium.

An example of the gas of a halide of aluminum is for example a gas of aluminum chloride (a gas of $AlCl_3$ and a gas of $Al_2Cl_6$). Preferably, a gas of $AlCl_3$ is used. The gas of a halide of aluminum preferably has a concentration (% by volume) of 0.3% by volume or more and 1.5% by volume or less, more preferably 0.8% by volume or more and 0.9% by volume or less with reference to the total volume of the first gas.

Examples of the gas of a halide of titanium include a gas of titanium (IV) chloride (a gas of $TiCl_4$), a gas of titanium (III) chloride (a gas of $TiCl_3$). Preferably a gas of titanium (IV) chloride is used. The gas of a halide of titanium preferably has a concentration (in % by volume) of 0.1% by volume or more and 1% by volume or less, more preferably 0.1% by volume or more and 0.2% by volume or less with reference to the total volume of the first gas.

In the first gas, the gas of a halide of aluminum has a molar ratio preferably of 0.5 or more and 0.9 or less, more preferably 0.8 or more and 0.9 or less with reference to the total moles of the gas of a halide of aluminum and the gas of a halide of titanium.

The first gas may include a gas of hydrogen and may include an inert gas such as a gas of argon. The inert gas preferably has a concentration (% by volume) of 5% by volume or more and 70% by volume or less, more preferably 20% by volume or more and 60% by volume or less with reference to the total volume of the first gas. The gas of hydrogen typically occupies the balance of the first gas.

The first gas is jetted onto the substrate at a flow rate preferably of 20 to 40 L/min.

(Second Gas)

The second gas includes a gas of a halide of aluminum, a gas of a halide of titanium, and a gas of ammonia. The gas of a halide of aluminum and the gas of a halide of titanium can be the gases exemplified in the above (First Gas) section. The gas of a halide of aluminum and the gas of a halide of titanium that are used for the first gas may be identical to or different from the gas of a halide of aluminum and the gas of a halide of titanium that are used for the second gas, respectively.

The gas of a halide of aluminum preferably has a concentration (% by volume) of 4% by volume or more and 5% by volume or less, more preferably 4.3% by volume or more and 4.5% by volume or less with reference to the total volume of the second gas.

The gas of a halide of titanium preferably has a concentration (in % by volume) of 0.1% by volume or more and 1% by volume or less, more preferably 0.5% by volume or more and 0.8% by volume or less with reference to the total volume of the second gas.

In the second gas, the gas of a halide of aluminum has a molar ratio preferably of 0.82 or more and 0.95 or less, more preferably 0.85 or more and 0.9 or less with reference to the total moles of the gas of a halide of aluminum and the gas of a halide of titanium.

The gas of ammonia preferably has a concentration (% by volume) of 5% by volume or more and 15% by volume or less, more preferably 10% by volume or more and 13% by volume or less with reference to the total volume of the second gas.

The second gas may include a gas of hydrogen and may include an inert gas such as a gas of argon. The inert gas preferably has a concentration (% by volume) of 5% by volume or more and 50% by volume or less, more preferably 15% by volume or more and 17% by volume or less with reference to the total volume of the second gas. The gas of hydrogen typically occupies the balance of the second gas.

The second gas is jetted onto the substrate at a flow rate preferably of 20 to 40 L/min.

(Third Gas)

The third gas includes a gas of ammonia. The third gas may include a gas of hydrogen and may include an inert gas such as a gas of argon.

The gas of ammonia preferably has a concentration (% by volume) of 2% by volume or more and 30% by volume or less, more preferably 2% by volume or more and 10% by volume or less with reference to the total volume of the third gas. The gas of hydrogen typically occupies the balance of the third gas.

The third gas is jetted onto the substrate at a flow rate preferably of 10 to 20 L/min.

<Third Step: A Blasting Step>

In this step, the coating is subjected to blasting. The blasting is performed for example under the conditions indicated below. The blasting can impart compressive residual stress to the coating.

Blasting conditions

Medium: 500 g of zirconia particles

Projection angle: 45°

Projection distance: 50 mm

Projection time: 3 seconds

<Another Step>

In the manufacturing method according to the present embodiment, in addition to the steps described above, an additional step may be performed, as appropriate, within a range that does not impair an effect of the present embodiment. Examples of the additional step include the step of forming an underlying layer between the substrate and the AlTiN layer, and the step of forming a surface layer on the AlTiN layer. The underlying layer and the surface layer may be formed in any method, and the layers are formed for example through CVD. When the step of forming the surface layer on the AlTiN layer is performed, the third step is performed after the surface layer is formed.

In the method for manufacturing a cutting tool according to the present embodiment, the AlTiN layer is formed through CVD. When this is compared with forming the coating through PVD, the former enhances the coating's adhesion to the substrate (or coating adhesion).

What has been described above includes features given in the following Notes.

(Note 1)

A surface-coated cutting tool including a rake face, a flank face, and a cutting edge portion connecting the rake face and the flank face together, the cutting tool comprising a substrate and an AlTiN layer provided on the substrate, the AlTiN layer including cubic $Al_xTi_{1-x}N$ crystal grains, the atomic ratio x of Al in the $Al_xTi_{1-x}N$ being 0.7 or more and 0.95 or less, the AlTiN layer including a central portion, the central portion being a region sandwiched between an imaginary plane D and an imaginary plane E, the imaginary plane D being an imaginary plane which passes through a point 1 μm away in a direction of thickness from a first interface located on a side of the substrate and is parallel to the first interface, the imaginary plane E being an imaginary plane which passes through a point 1 μm away from a second interface opposite to the side of the substrate in the direction of thickness and is parallel to the second interface, the first interface being parallel to the second interface, when a cross section of the AlTiN layer obtained when cut along a plane including a normal to the second interface at the rake face and a normal to the second interface at the flank face is subjected to an electron backscattering diffraction image analysis using a field emission scanning microscope to determine a crystal orientation of each of the $Al_xTi_{1-x}N$ crystal grains and a color map is created based thereon, in the color map, the central portion at the rake face being occupied in area at a ratio of 80% or more by $Al_xTi_{1-x}N$ crystal grains having a (200) plane with a normal thereto having a direction within ±15° with respect to a direction of the normal to the second interface at the rake face, the central portion at the flank face being occupied in area at a ratio of 80% or more by $Al_xTi_{1-x}N$ crystal grains having the (200) plane with a normal thereto having a direction within ±15° with respect to a direction of the normal to the second interface at the flank face, the central portion at the cutting edge portion being occupied in area at a ratio of 80% or more by $Al_xTi_{1-x}N$ crystal grains having the (200) plane with a normal thereto having a direction within ±15° with respect to a direction of a normal to the cutting edge portion, the direction of the normal to the cutting edge portion being a direction of a normal to an imaginary plane C including a boundary line on the substrate between the rake face and the cutting edge portion and a boundary line on the substrate between the flank face and the cutting edge portion.

(Note 2)

The surface-coated cutting tool according to Note 1, wherein the AlTiN layer has a thickness of 2.5 μm or more and 20 μm or less.

(Note 3)

The surface-coated cutting tool according to Note 1 or 2, further comprising an underlying layer provided between the substrate and the AlTiN layer, wherein the underlying layer is composed of a compound consisting of: at least one element selected from the group consisting of a group 4 element, a group 5 element and a group 6 element of the periodic table and Al; and at least one element selected from the group consisting of carbon, nitrogen, oxygen and boron.

(Note 4)

The surface-coated cutting tool according to any one of Notes 1 to 3, further comprising a surface layer provided on the AlTiN layer, wherein the surface layer is composed of a compound consisting of: at least one element selected from the group consisting of a group 4 element, a group 5 element and a group 6 element of the periodic table and Al; and at least one element selected from the group consisting of carbon, nitrogen, oxygen and boron.

Examples

Hereinafter, the present invention will more specifically be described with reference to examples although the present invention is not limited thereto.

<<Manufacturing a Cutting Tool>>

<Preparing a Substrate>

Initially, as a substrate on which a coating to be formed, a substrate composed of cemented carbide indicated in Table 1 below (hereinafter also simply referred to as a "substrate") was prepared (a first step). Specifically, initially, powdery raw materials of a blending composition (% by mass) shown in Table 1 were uniformly mixed. "Balance" in Table 1 indicates that WC occupies the balance of the blending composition (% by mass).

TABLE 1

| type | blending composition (mass %) | | | |
|---|---|---|---|---|
| | Co | $Cr_3C_2$ | TaC | WC |
| substrate | 13.0 | 0.3 | 0.5 | balance |

Subsequently, the powdery mixture is pressure-formed into a prescribed shape and thereafter sintered for 1 to 2 hours at 1300 to 1500° C. to obtain the above substrate (substrate shape (JIS standard): SEET13T3AGSN-G, cutter diameter: 100). SEET13T3AGSN-G is a shape of an indexable cutting insert for a rotating tool.

<Preparing a Coating>

A coating was formed on a surface of the substrate by forming the underlying layer, the AlTiN layer and the surface layer shown in Table 8 on the surface of the substrate. The coating was formed mainly through CVD. Hereinafter, a method for depositing each layer constituting the coating will be described.

(Depositing an AlTiN Layer)

Under the conditions shown in Table 2 for deposition, a first gas, a second gas, and a third gas having the compositions shown in Tables 3, 4 and 5, respectively, were jetted in this order repeatedly onto a surface of the substrate to deposit an AlTiN layer (a second step). In doing so, the substrate was set on a protrusion provided on a substrate setting jig. Further, the gas jetting throughholes and the substrate were sufficiently spaced (e.g., by 5 cm). When an underlying layer was provided on a surface of the substrate, an AlTiN layer was formed on a surface of the underlying layer.

For example, an AlTiN layer indicated in Table 6 by an identification symbol [1] was deposited as follows: with a temperature of 780° C., a pressure of 3 kPa, and the gas introduction pipe having a rotational speed of 2 rpm set as conditions for deposition (as indicated in Table 2 by an identification symbol 2-a), a first gas indicated in Table 3 by an identification symbol 3-a (0.83% by volume of $AlCl_3$, 0.17% by volume of $TiCl_4$, 60% by volume of Ar, and a balance of $H_2$, with a gas flow rate of 20 L/min), a second gas indicated in Table 4 by an identification symbol 4-a (4.3% by volume of $AlCl_3$, 0.8% by volume of $TiCl_4$, 11% by volume of $NH_3$, 15% by volume of Ar, and a balance of $H_2$, with a gas flow rate of 40 L/min), and a third gas indicated in Table 5 by an identification symbol 5-a (2% by volume of $NH_3$, and a balance is $H_2$, with a gas flow rate of 10 L/min) were jetted in this order repeatedly onto a surface of the substrate to deposit the AlTiN Layer. An AlTiN layer indicated in Table 6 by an identification symbol [8] was deposited in a known PVD method. Table 6 shows each deposited AlTiN layer's composition and others.

TABLE 2

| conditions for deposition | |
|---|---|
| identification symbol | 2-a |
| temperature (° C.) | 780 |
| pressure (kPa) | 3 |
| rotational speed (rpm) | 2 |

TABLE 3

| composition of 1 st gas | | | | |
|---|---|---|---|---|
| identification symbol | 3-a | 3-b | 3-c | 3-d |
| $AlCl_4$ (vol %) | 0.83 | 0.90 | 0.85 | 0.95 |
| $TiCl_4$ (vol %) | 0.17 | 0.10 | 0.15 | 0.05 |
| $AlCl_3/(AlCl_3 + TiCl_4)$ (molar ratio) | 0.83 | 0.90 | 0.85 | 0.95 |
| Ar (vol %) | 60 | 20 | 60 | 20 |
| $H_2$ (vol %) | balance | balance | balance | balance |
| gas flow rate (L/min) | 20 | 20 | 20 | 20 |

TABLE 4

| composition of 2nd gas | | | |
|---|---|---|---|
| identification symbol | 4-a | 4-b | 4-c |
| $AlCl_3$ (vol %) | 4.3 | 4.5 | 5.0 |
| $TiCl_4$ (vol %) | 0.8 | 0.5 | 0.5 |
| $AlCl_3/(AlCl_3 + TiCl_4)$ (molar ratio) | 0.85 | 0.90 | 0.91 |
| $NH_3$ (vol %) | 11 | 13 | 17 |
| Ar (vol %) | 15 | 17 | 15 |
| $H_2$ (vol %) | balance | balance | balance |
| gas flow rate (L/min) | 40 | 40 | 40 |

TABLE 5

| composition of 3rd gas | |
|---|---|
| identification symbol | 5-a |
| $NH_3$ (vol %) | 2 |
| $H_2$ (vol %) | balance |
| gas flow rate (L/min) | 10 |

TABLE 6

| identification symbol | AlTiN layer | | atomic h/(c + h) ratio (vol %) | ratio x of Al in $Al_xTi_{1-x}N$ | ratio in area of (200) oriented crystal grains (%) | | |
|---|---|---|---|---|---|---|---|
| | table 3 | table 4 | | | rake face | cutting edge portion | flank face |
| [1] | 3-a | 4-a | 4 | 0.82 | 89 | 94 | 90 |
| [2] | 3-b | 4-a | 5 | 0.84 | 88 | 91 | 85 |
| [3] | 3-c | 4-a | 3 | 0.82 | 92 | 94 | 91 |
| [4] | 3-a | 4-b | 4 | 0.84 | 85 | 89 | 84 |
| [5] | 3-c | 4-b | 3 | 0.86 | 81 | 83 | 82 |
| [6] | 3-b | 4-c | 5 | 0.83 | 74 | 78 | 74 |
| [7] | 3-d | 4-a | 21 | 0.97 | 82 | 84 | 84 |
| [8]* | none | none | 3 | 0.65 | 82 | 83 | 82 |

*deposited in a known PVD method.

(Depositing an Underlying Layer and Depositing a Surface Layer)

Under conditions indicated in Table 7 for deposition, a reactant gas having a composition indicated in Table 7 was jetted onto a surface of the substrate to deposit an underlying layer. Under conditions indicated in Table 7 for deposition, a reactant gas having a composition indicated in Table 7 was jetted onto a surface of the AlTiN layer to deposit a surface layer.

TABLE 7

| | | conditions for deposition | | |
|---|---|---|---|---|
| type | composition of reactant gas (vol %) | pressure (kPa) | temperature (° C.) | gas flow rate (L/min) |
| TiN | TiCl$_4$ = 0.5%, N$_2$ = 41.2%, H$_2$ = balance | 79.8 | 780 | 45.9 |
| TiCN | TiCl$_4$ = 2.0%, CH$_3$CN = 0.7%, H$_2$ = balance | 9 | 860 | 50.5 |
| Al$_2$O$_3$ | AlCl$_3$ = 1.6%, CO$_2$ = 4.5%, H$_2$S = 0.2%, NO$_2$ = 0.5%, H$_2$ = balance | 6.7 | 850 | 46.2 |

(Blasting)

The coating on the surface of the substrate was blasted under the following conditions (a third step):

Blasting conditions
Medium: 500 g of zirconia particles
Projection angle: 45°
Projection distance: 50 mm
Projection time: 3 seconds A cutting tool according to the present example was thus manufactured through the above process. The cutting tools of Sample Nos. 1 and 4 to 10 include a substrate, an AlTiN layer provided on the substrate, and an underlying layer provided between the substrate and the AlTiN layer. The cutting tools of Sample Nos. 2 and 3 include a substrate, an AlTiN layer provided on the substrate, an underlying layer provided between the substrate and the AlTiN layer, and a surface layer provided on the AlTiN layer.

<<Evaluating Characteristics of Cutting Tools>>

Using the cutting tools of the samples manufactured as described above, the cutting tools' characteristics were evaluated as follows: The cutting tools of Sample Nos. 1 to 7 correspond to examples. The cutting tools of Sample Nos. 8 to 10 correspond to comparative examples.

<Measuring Thickness of Coating and the Like>

The coating and the underlying, AlTiN and surface layers constituting the coating were measured in thickness by measuring each layer at any 10 points of a sample in a cross section parallel to the direction of a normal to a surface of the substrate with a scanning transmission electron microscope (STEM) (manufactured by JEOL Ltd., trade name: JEM-2100F), and calculating an average value in thickness of the measured 10 points. A result is shown in Table 8. In the "surface layer" column, "none" indicates that the surface layer does not exist in the coating. Furthermore, in the "AlTiN layer" column, an indication such as "[1] (5.0)" indicates that an AlTiN layer has a configuration indicated in Table 6 by identification symbol [1] and has a thickness of 5.0 μm. In Table 8, an indication such as "TiCN (1.0)" indicates that the corresponding layer is a TiCN layer having a thickness of 1.0 μm. Two compounds indicated in one column (for example, "Al$_2$O$_3$ (0.2)-TiN (0.1)") indicate that the compound on the left side (Al$_2$O$_3$ (0.2)) is a layer located on a side closer to a surface of the substrate and the compound on the right side (TiN (0.1)) is a layer located on a side farther from the surface of the substrate. Furthermore, an indication such as "[Al$_2$O$_3$ (0.2)-TiN (0.1)]×3" or the like means that a layer represented by "Al$_2$O$_3$ (0.2)-TiN (0.1)" is deposited three times repeatedly.

TABLE 8

| | coating's configuration & each layer's thickness | | | |
|---|---|---|---|---|
| sample nos. | underlying layer (μm) | AlTiN layer (μm) | surface layer (μm) | total coating thickness (μm) |
| 1 | TiCN (1.0) | [1] (5.0) | none | 6.0 |
| 2 | TiCN (1.0) | [1] (4.5) | Al$_2$O$_3$ (0.5) | 6.0 |
| 3 | TiCN (0.5) | [1] (3.6) | [Al$_2$O$_3$(0.2)—TiN(0.1)] × 3 | 6.0 |
| 4 | TiCN (1.0) | [2] (5.0) | none | 6.0 |
| 5 | TiCN (1.0) | [3] (5.0) | none | 6.0 |
| 6 | TiCN (1.0) | [4] (5.0) | none | 6.0 |
| 7 | TiCN (1.0) | [5] (5.0) | none | 6.0 |
| 8 | TiCN (1.0) | [6] (5.0) | none | 6.0 |
| 9 | TiCN (1.0) | [7] (5.0) | none | 6.0 |
| 10 | none | [8] (5.0) | none | 5.0 |

<Creating a Color Map>

Initially, the cutting tool was cut so that a cross section perpendicular to a surface (or an interface) of the AlTiN layer in the coating was obtained. Subsequently, the cut surface was polished with waterproof abrasive paper (manufactured by Noritake Coated Abrasive Co., Ltd. (NCA), trade name: WATERPROOF PAPER, #400, #800, #1500) to prepare a processed surface of the AlTiN layer. Subsequently, the processed surface is further smoothed by ion milling using Ar ions. The ion milling was performed under the following conditions:

Acceleration voltage: 6 kV
Irradiation angle: 0° from the direction of a normal to the second interface of the AlTiN layer (that is, the direction of a straight line parallel to the direction of the thickness of the AlTiN layer at the cut surface)
Irradiation time: 6 hours The thus prepared processed surface was observed with an EBSD equipped FE-SEM (trade name: "SU6600" manufactured by Hitachi High-Technologies Corporation) at a magnification of 5000 times to create a color map of the processed surface for an observation area of 10 μm (in the direction of the thickness of the AlTiN layer)×50 μm (in a direction parallel to an interface of the AlTiN layer). In doing so, an analysis was done using a focused electron beam set so that it was reflected at the AlN layer in the crystal grains of Al$_x$Ti$_{1-x}$N. Three such color maps were created (in other words, measurement was done in three fields of view). Specifically, initially, the crystal orientation of each crystal grain included in the cross section of the AlTiN layer was determined. The crystal orientation of each crystal grain as determined herein is a crystal orientation observed when each crystal grain appearing in the cross section of the AlTiN layer is viewed in a plan view in the direction of a normal to that cross section (that is, a direction penetrating the plane of the sheet of FIG. 9). Based on the crystal orientation of each crystal grain determined, the crystal orientation of each crystal grain in the direction of the normal to the second interface of the AlTiN layer was determined. A color map was created based on the determined crystal orientation (for example, see FIG. 9). For each color map, a ratio in area of the central portion of the AlTiN layer occupied by (200) oriented crystal grains was determined using commercially available software (trade name: "Orientation Imaging Microscopy Ver 6.2" manufactured by EDAX Inc.). A result thereof is shown in table 6. Note that the central portion is a region sandwiched between an imaginary plane D and an imaginary plane E, the imaginary plane D being an imaginary plane which passes through a point 1 μm away in a direction of thickness from a first interface located on the side of the substrate and is parallel to the first interface, the imaginary plane E being an imaginary plane which passes through a point 1 μm away from a second interface opposite to the side of the substrate in the direction of thickness and is parallel to the second interface. (For example, see FIG. 9).

Herein, the first interface and the second interface were defined in the color map, as follows: Initially, in the color map, the area of the AlTiN layer and that other than the AlTiN layer were differently colored and displayed so that they were distinguishable. A straight line that passes a center between a straight line L1 that passes through a point on the side of the substrate farthest from the substrate in the direction of a normal to a major surface of the substrate in the color map and is also parallel to the major surface of the substrate and a straight line L2 that passes through a point on the side of the substrate closest to the substrate in the same direction and is also parallel to the major surface of the substrate is defined as first interface 11a (see FIG. 9 for example). A straight line that passes a center between a straight line M1 that passes through a point on the side opposite to the substrate farthest from the substrate in the direction of the normal to the major surface of the substrate in the color map and is also parallel to the major surface of the substrate and a straight line M2 that passes through a point on the side opposite to the substrate closest to the substrate in the same direction and is also parallel to the major surface of the substrate is defined as the second interface (see FIG. 9 for example).

Table 6 shows a ratio in area of (200) oriented crystal grains at each of the rake face, the cutting edge and the flank face. In the cutting edge portion, crystal grains having the (200) plane with a normal thereto having a direction within ±15° with respect to the direction of a normal to imaginary plane C including boundary line AA on the substrate between the rake face and the cutting edge portion and boundary line BB on the substrate between the flank face and the cutting edge portion were considered as (200) oriented crystal grains.

<<Cutting Test>>

(Cutting Evaluation: Interrupted Processing Test)

Using the cutting tools of the thus prepared samples (sample nos. 1 to 10) under the cutting conditions indicated below, a cutting distance (m) reached when the flank face was worn by an amount of 0.25 mm or the rake face, the cutting edge portion or the flank face was abnormally (e.g., partially) worn or broken was measured. Moreover, how the cutting tools were damaged after cutting (or a final damaged state) was observed. A result thereof is shown in table 9. The present inventors consider that under the following cutting conditions, a cutting tool is abnormally worn or broken, starting from chipping caused in the cutting tool. In other word, a cutting tool providing a longer cutting distance can be evaluated as a cutting tool having better flank wear resistance or chipping resistance. When a cutting tool in a damaged state after cutting has no breakage observed, the cutting tool can be evaluated as having excellent breaking resistance or excellent chipping resistance.

Test conditions for interrupted processing
Workpiece: SUS630 (a block material, W300×L50)
Cutting speed: 250 m/min
Feed rate: 0.3 mm/t
Cutting Depth: 2 mm
Cutting width: 60 mm
Cutting oil: Wet type

TABLE 9

| sample nos. | cutting distance (m) | final damaged state |
|---|---|---|
| 1 | 3.0 | normally worn |
| 2 | 3.0 | normally worn |
| 3 | 3.6 | normally worn |
| 4 | 3.0 | normally worn |
| 5 | 3.3 | normally worn |
| 6 | 2.7 | normally worn |
| 7 | 2.7 | normally worn |
| 8 | 1.5 | abnormally worn, broken |
| 9 | 1.2 | broken |
| 10 | 0.3 | abnormally worn, broken |

As can be seen in Table 9, the cutting tools of sample Nos. 1-7 (that is, the cutting tools of the examples) provided a good result of a cutting distance of 2.7 m or more in interrupted processing. The cutting tools of Sample Nos. 1 to 7 were normally worn (normally worn). That is, the cutting tools of Sample Nos. 1 to 7 were not confirmed to have breakage at each of the rake face, the cutting edge portion and the flank face. In contrast, the cutting tools of sample nos. 8 to 10 (the cutting tools of the comparative examples) provided a cutting distance of 1.5 m or less in interrupted processing. The cutting tool of Sample No. 10 had abnormally large flank wear (abnormally worn). The cutting tools of Sample Nos. 8, 9 and 10 were confirmed to have any one of the rake face, the cutting edge portion and the flank face abnormally (e.g., partially) worn or broken, starting from chipping. From the above results, it has been found that the cutting tools of the examples had excellent chipping resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST 1 cutting tool, 1a rake face, 1b flank face, 1c cutting edge portion, 10 substrate, 11 AlTiN layer, 11a first interface, 11b second interface, 11c central portion of AlTiN layer, 11d (200) oriented crystal grains, 12 underlying layer, 13 surface layer, 14 coating, 50 CVD apparatus, 52 substrate setting jig, 53 reaction chamber, 54 temperature controller, 55 first gas introduction pipe, 56 second gas introduction pipe, 57 third gas introduction pipe, 58 gas introduction pipe, 59 gas exhaust pipe, 60 gas exhaust port, A imaginary plane A, B imaginary plane B, C imaginary plane C, D imaginary plane D, E imaginary plane E, AA boundary line AA, BB boundary line BB, L1 straight line L1, L2 straight line L2, M1 straight line M1, M2 straight line M2

The invention claimed is:

1. A cutting tool including a rake face, a flank face, and a cutting edge portion connecting the rake face and the flank face together, the cutting tool comprising a substrate and an AlTiN layer provided on the substrate, the AlTiN layer including cubic $Al_xTi_{1-x}N$ crystal grains, an atomic ratio x of Al in the cubic $Al_xTi_{1-x}N$ crystal grains being 0.7 or more and 0.95 or less on each of the rake face, the flank face and the cutting edge portion, the AlTiN layer including a central portion, the central portion of the AlTiN layer being a region sandwiched between a first imaginary plane and a second imaginary plane, the first imaginary plane being an imaginary plane which passes through a point 1 μm away in a direction of thickness from a first interface located on a side of the substrate and is parallel to the first interface, the second imaginary plane being an imaginary plane which passes through a point 1 μm away from a second interface opposite to the side of the substrate in the direction of thickness and is parallel to the second interface, the first interface being parallel to the second interface, the central portion of the AlTiN layer at the rake face being occupied in area at a ratio of 80% or more by first cubic $Al_xTi_{1-x}N$ crystal grains having a (200) plane with a normal thereto having a direction within ±15° with respect to a direction of a normal to the second interface at the rake face, the central portion of the AlTiN layer at the flank face being occupied in area at a ratio of 80% or more by second cubic $Al_xTi_{1-x}N$ crystal grains having a (200) plane with a normal thereto having a direction within ±15° with respect to a direction of a normal to the second interface at the flank face, the central portion of the AlTiN layer at the cutting edge portion being occupied in area at a ratio of 80% or more by third cubic $Al_xTi_{1-x}N$ crystal grains having a (200) plane with a normal thereto having a direction within ±15° with respect to a direction of a normal to the cutting edge portion, the direction of the normal to the cutting edge portion being a direction of a normal to a third imaginary plane including a boundary line on the substrate between the rake face and the cutting edge portion and a boundary line on the substrate between the flank face and the cutting edge portion.

2. The cutting tool according to claim 1, wherein the AlTiN layer has a thickness of 2.5 μm or more and 20 μm or less.

3. The cutting tool according to claim 1, further comprising:
an underlying layer provided between the substrate and the AlTiN layer,
wherein the underlying layer is composed of a compound consisting of:
at least one element selected from the group consisting of a group 4 element, a group 5 element and a group 6 element of the periodic table and aluminum; and
at least one element selected from the group consisting of carbon, nitrogen, oxygen or boron.

4. The cutting tool according to claim 1, further comprising:
a surface layer provided on the AlTiN layer,
wherein the surface layer is composed of a compound consisting of:
at least one element selected from the group consisting of a group 4 element, a group 5 element and a group 6 element of the periodic table and aluminum; and
at least one element selected from the group consisting of carbon, nitrogen, oxygen or boron.

5. The cutting tool according to claim 1, wherein the atomic ratio x of Al in the $Al_xTi_{1-x}N$ is 0.8 or more and 0.9 or less.

6. The cutting tool according to claim 1, wherein, in the central portion at the rake face, the ratio of 80% or more is a ratio of 81% or more and 98% or less.

7. The cutting tool according to claim 1, wherein, in the central portion at the flank face, the ratio of 80% or more is a ratio of 81% or more and 98% or less.

8. The cutting tool according to claim 1, wherein, in the central portion at the cutting edge portion, the ratio of 80% or more is a ratio of 81% or more and 98% or less.

9. The cutting tool according to claim 1, wherein the cutting edge portion consists of an arcuate surface.

10. The cutting tool according to claim 1, wherein the cutting edge portion consists of a flat surface.

11. The cutting tool according to claim 1, wherein the cutting edge portion consists of a flat surface connected to an arcuate surface.

12. The cutting tool according to claim 1, further comprising an underlying layer between the AlTiN layer and the substrate.

13. The cutting tool according to claim 1, further comprising a surface layer on the AlTiN layer.

* * * * *